United States Patent [19]

Casey, Jr. et al.

[11] 4,231,050
[45] Oct. 28, 1980

[54] REDUCTION OF SURFACE RECOMBINATION CURRENT IN GAAS DEVICES

[75] Inventors: Horace C. Casey, Jr.; Alfred Y. Cho, both of Summit; Philip W. Foy, Plainfield, all of N.J.

[73] Assignee: Bell Telephone Laboratories, Incorporated, Murray Hill, N.J.

[21] Appl. No.: 7,790

[22] Filed: Jan. 30, 1979

[51] Int. Cl.³ .................................... H01B 29/161
[52] U.S. Cl. .................................... 357/16; 357/52; 357/54; 357/17; 357/67; 357/30
[58] Field of Search ................ 357/52, 54, 16, 17, 357/67, 30

[56] References Cited

U.S. PATENT DOCUMENTS

| | | | |
|---|---|---|---|
| 3,990,096 | 11/1976 | Namizaiki | 357/18 |
| 4,062,035 | 12/1977 | Winstel | 357/17 |
| 4,141,021 | 2/1979 | Decker | 357/22 |
| 4,160,261 | 7/1979 | Casey et al. | 357/23 |

OTHER PUBLICATIONS

Casey, *Appl. Phys. Lett.*, vol. 32, No. 10, May 15, 1978, pp. 678–679.

*Primary Examiner*—Martin H. Edlon
*Attorney, Agent, or Firm*—Michael J. Urbano

[57] ABSTRACT

Surface recombination current in GaAs devices is reduced by means of a semi-insulating, oxygen, iron or chromium doped monocrystalline layer of AlGaAs grown by MBE. The AlGaAs layer is grown on a GaAs body and is then masked. Diffusion of suitable impurities through a window in the mask converts the exposed portions of the AlGaAs layer to low resistivity and modifies the conductivity of the underlying zone of the GaAs body. The peripheral portions of the AlGaAs layer, however, remain semi-insulating and are effective to reduce the surface recombination velocity - diffusion length product by more than an order of magnitude.

8 Claims, 1 Drawing Figure

U.S. Patent    Oct. 28, 1980    4,231,050
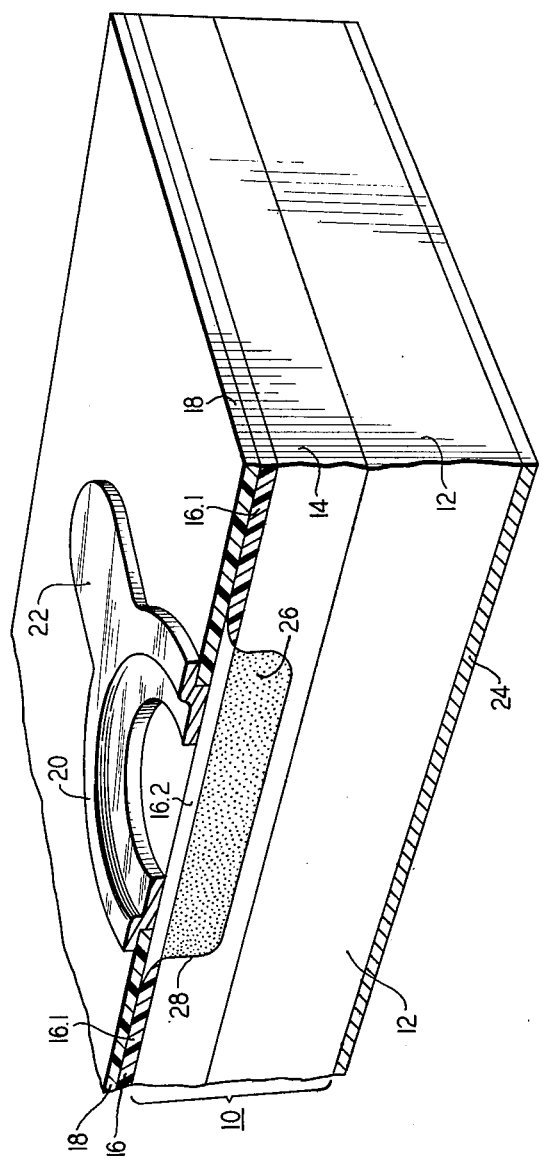

REDUCTION OF SURFACE RECOMBINATION CURRENT IN GAAS DEVICES

BACKGROUND OF THE INVENTION

This invention relates to GaAs devices and, more particularly, to the reduction of surface recombination current in such devices.

In the area of Group III-V compound semiconductors recent investigation of the current-voltage behavior of $Al_xGa_{1-x}As$—$Al_yGa_{1-y}As$—$Al_xGa_{1-x}As$ ($0 \leq y < x$), double heterostructure, p-n junction devices has shown that surface recombination is responsible for the observed 2kT current. This surface recombination current is due to nonradiative electron-hole recombination in the surface depletion region at the junction perimeter. Earlier studies of surface current had been concerned with $GaP_{0.4}As_{0.6}$ and GaP light-emitting diodes where the surface current was also found to be the dominant 2kT current. Etching the GaP surface in a $CF_3$ plasma did reduce the surface current. However, desorption of F resulted in reversion to the etched surface values. In silicon technology, on the other hand, growth of $SiO_2$ on Si can greatly reduce the surface recombination current. However, surface chemical treatment or the growth of native oxides, $SiO_2$ or silicon nitride on GaAs has not been helpful, and the reduction of the surface recombination current on GaAs has eluded solution.

SUMMARY OF THE INVENTION

In accordance with an illustrative embodiment of our invention, the surface recombination current in a GaAs device is reduced by a process which includes epitaxially growing by molecular beam epitaxy (MBE) semi-insulating $Al_xGa_{1-x}As$ monocrystalline layer ($x \gtrsim 0.4$ preferably) on a major surface of a GaAs monocrystalline body, depositing a suitable masking layer, such as silicon nitride, on the AlGaAs layer, opening a window in the masking layer to expose a portion of the underlying AlGaAs layer but leaving adjacent portions of the AlGaAs covered by the masking layer, diffusing impurities through the window, through the AlGaAs layer and into the underlying zone of the GaAs body, thereby substantially decreasing the resistivity of the exposed portion of the AlGaAs layer and modifying the conductivity of underlying zone of the GaAs body, and forming electrical contacts to the now low resistivity portion of the AlGaAs layer and to the GaAs body.

The diffused impurities may modify the conductivity of the underlying zone of the GaAs body in several ways well known in the art. Acceptors diffused into an n-type GaAs body may result in a p-type or compensated zone under the window and hence a p-n junction at the diffusion boundary. In a similar fashion, donors may be diffused into a p-type GaAs body to form a p-n junction. Devices incorporating such junctions may function in various ways, for example, as light-emitting diodes, photodiodes, or field effect transistors. Alternatively, donors or acceptors may be diffused into a GaAs body of the same conductivity type to increase the cnductivity of the zone of the GaAs body under the window. This procedure might be useful in facilitating the formation of ohmic contacts, for example. In each case above, however, the diffusion of impurities converts the portion of the semi-insulating AlGaAs layer in the window to a low resistivity layer, thus permitting the formation of low resistance electrical contacts. However, the adjacent peripheral portions of the AlGaAs layer under the mask remain highly resistive and, in accordance with one feature of our invention, serve to significantly reduce surface recombination current. In one example of the above process an oxygen-doped AlGaAs semi-insulating layer was used to reduce the intrinsic surface recombination velocity—surface diffusion length product of a Zn-diffused p-n junction GaAs device by more than an order of magnitude from 3.7 $cm^2/sec$ to 0.3 $cm^2/sec$. Other dopants such as iron and chromium, also render AlGaAs semi-insulating and, we believe, would also be effective in reducing surface recombination current.

In addition, the masking layer, illustratively silicon nitride, remains on the end product and provides protection from the environment so that the combination of nitride-AlGaAs meets the requirements of GaAs surface passivation.

BRIEF DESCRIPTION OF THE DRAWING

Our invention, together with its various features and advantages, can be readily understood from the following more detailed description taken in conjunction with the accompanying drawing in which the sole FIGURE is a cross-sectional, isometric view of a GaAs semiconductor device fabricated in accordance with an illustrative embodiment of our invention. For the sake of clarity, the device is not drawn to scale.

DETAILED DESCRIPTION

With reference now to the drawing, a GaAs semiconductor device is shown comprising a GaAs monocrystalline body 10 which may include, for example, a substrate 12 and an epitaxial layer 14. A monocrystalline, semi-insulating $Al_xGa_{1-x}As$ layer 16 ($x \gtrsim 0.4$ preferably) is grown on one major surface of body 10 (or epitaxial layer 14) and a dielectric masking layer 18 is deposited on layer 16. Layer 16 is typically doped with oxygen but iron and chromium may also be suitable, Preferably, layer 16 is thick enough (e.g., >1000 Angstroms) to prevent any appreciable tunneling therethrough. Layer 18 has a generally circular window therein, and an annular metal electrode 20 is formed in the window in contact with an annular portion of layer 16 exposed by the window. Electrode 20 includes an appendage 22 to which an electrical lead or conductor (not shown) may be connected. Appendage 22 does not, however, contact AlGaAs layer 16. A metal layer on the opposite major surface of body 10 forms a counter electrode 24.

Body 10 includes a diffused zone 26 in substantial registration with the window. Localized zone 26 has its conductivity modified with respect to the remaining portions of the body. A feature of the device is that the peripheral portions 16.1 of the AlGaAs layer 16 (i.e., those under masking layer 18) have a relatively high resistivity and are effective to significantly reduce surface recombination current, but the central portions 16.2 in the window have much lower resistivity so as to facilitate making good ohmic contact to the upper major surface of body 10.

As discussed previously, zone 26 may have either n-type, p-type, or compensated conductivity so that boundary 28 between zone 26 and the remainder of body 10 may be either a p-n junction, an n-n+ interface or a p-p+ interface. When boundary 28 is a p-n junction, the device can function as a light-emitting diode under forward bias or as a photodiode under reverse bias with light emitted or detected propagating through the window in layer 18. On the other hand, when boundary 28 is n-n+ or p-p+, then zone 26 would typically have higher conductivity than the adjacent portions of body 10 so as to facilitate making good ohmic contact to body 10 as mentioned above. A pair of spaced zones 26 and a well-known gate electrode configuration (not shown) may be used as a field effect transistor.

The fabrication of the GaAs device starts with obtaining a GaAs substrate 12 from commercial sources. If desired, an epitaxial layer of GaAs 14, of the same conductivity type as substate 12, may be grown thereon by any of several well-known growth techniques including LPE, VPE or MBE. Next, MBE is used to grow a semi-insulating, monocrystalline, $Al_xGa_{1-x}As$ layer 16 on the upper major surface of body 10 as described by H. C. Casey, Jr., A. Y. Cho, and E. H. Nicollian in copending application, Ser. No. 869,369, filed on Jan. 13, 1978, and assigned to the assignee hereof. Layer 16 is typically doped with oxygen during MBE growth but iron and chromium may also be suitable in achieving its semi-insulating character. Preferably, $x \gtrsim 0.4$ so that layer 16 is an indirect gap, and hence low mobility, material. By semi-insulating we mean a resistivity preferably in the range of about $10^8$ to $10^{12}$ $\Omega$-cm. Layer 16 also thick enough to prevent any appreciable tunneling and is illustratively several thousand Angstroms thick.

A dielectric masking layer 18, such as silicon nitride, is then deposited on layer 16 and, using standard plasma etching or photolithographic techniques, a window is opened therein to expose the underlying portion 16.2 of layer 16. A dopant (e.g., Zn) is then diffused through the window to modify the conductivity of body 10 in zone 26 (e.g., to form a p-n junction 28) and, at the same time, to convert the portion 16.2 of AlGaAs layer 16 from high resistivity to low resistivity (e.g., about $10^{-1}$ to $10^{-3}$ $\Omega$-cm). While the dopant atoms do diffuse laterally to some small extent, by and large the peripheral portions 16.1 of layer 16 remain highly resistive and thus reduce surface recombination current.

Electrodes 20 and 24 are formed by standard masking and deposition methods (e.g., vacuum evaporation or electroplating).

EXAMPLE

The following example is given by way of illustration only. Unless otherwise stated, therefore, device parameters, growth conditions and the like should not be construed as limitations on the scope of the invention.

An n-type GaAs (100)-oriented substrate 12 doped with Si to about $10^{18}$ cm$^{-3}$ was obtained from commercial sources. In a standard MBE ultra-high vacuum system the following layers were epitaxially grown on the substrate: 1 $\mu$m thick buffer layer (now shown) of GaAs doped n-type with Sn to about $2\times 10^{18}$ cm$^{-3}$; an n-type GaAs layer 14 about 3 $\mu$m thick and also doped with Sn to about $5.4\times 10^{16}$ cm$^{-3}$; and an oxygen-doped $Al_{0.5}Ga_{0.5}As$ layer 16 about 2000 Angstroms thick.

Both to mask the diffusion and to provide protection from the environment, a 1000-1500 Angstrom thick layer 18 of pyrolytic silicon nitride was deposited at 740 degrees C. Circular windows were opened by plasma etching, and a p-n junction 28 at a maximum depth of 2.5 $\mu$m was formed by Zn diffusion at 650 degrees C. for 4 h with a Zn/Ga/As source. The exposed portions 16.2 of the high resistivity $Al_{0.5}Ga_{0.5}As$ layer were converted to low resistivity by the incorporation of a high acceptor (Zn) concentration. Ohmic contact 20 to the portion 16.2 (and to zone 26) was obtained by the evaporation of a thin layer of Cr and then Au over the window—for simplicity an annular contact as shown in the FIGURE was not fabricated. Contact 24 to the n-type substrate 12 was made by evaporated and alloyed Sn-Pt-Sn.

Current-voltage (I-V) measurements were made on the resulting p-n junction device which had a junction area of about $2.8\times 10^{-4}$ cm$^2$. The current I varied as $I=I_o \exp(qV/nkT)$ with n=2.0 for V<0.9 V and with n=1.16 at a higher bias voltage. There was additional leakage below $10^{-10}$ A, although the current was only $10^{-12}$ A at 0.2 V. The reverse I-V characteristic was also measured. Near $-2$ V the current density was only $\sim 1\times 10^{-9}$ A/cm$^2$ and at $-8$ V the current density was $\sim 1\times 10^{-8}$ A/cm$^2$. Both of these values are very low current densities. Above $-8$ V the current rose rapidly due to microplasmas. In the low current region below $-8$ V, the current was found to be sensitive to the pressure of the mechanical probe. To reduce such effects an electrode configuration with a contact pad (e.g., the appendage 22) separate from the junction region may be used.

The forward bias I-V characteristics were measured for four different junction areas (a) between $a=8.1\times 10^{-5}$ and $2.6\times 10^{-3}$ cm$^2$. To permit comparison with similar GaAs p-n junctions without the oxygen-doped $Al_{0.5}Ga_{0.5}As$ layer, the $Al_{0.5}Ga_{0.5}As$ layer was removed by etching in warm HCl before depositing the silicon nitride. A significant difference in the I-V characteristics with and without the oxygen-doped $Al_{0.5}Ga_{0.5}As$ layer were illustrated by plotting the current at a fixed voltage as a function of the perimeter diameter (d) at the surface. For 1.0 V, the current for the case with the oxygen-doped $Al_{0.5}Ga_{0.5}As$ layer varied as d$^2$, while the current for the case without the oxygen-doped $Al_{0.5}Ga_{0.5}As$ layer varied linearly with d. The d$^2$ dependence indicates the dominance of bulk current because in this case the current is proportional to junction area. The linear d dependence indicates a dependence on perimeter and thus the dominance of surface recombination current. For 0.8 V, the current for the case with the oxygen-doped $Al_{0.5}Ga_{0.5}As$ layer varied more rapidly than linearly, but less than d$^2$, while current for the case without the oxygen-doped $Al_{0.5}Ga_{0.5}As$ layer still varied linearly with d. These p-n junction devices were bright in electroluminescence at low current ($\sim 1$ mA) because the minority carrier lifetime $\tau$ was near the limit given by radiative recombination, and the surface recombination current was negligible.

At V<0.9 V, the 2kT current dominated. The variation of the measured current with d was measured and used to determine $s_oL_s$, the intrinsic surface recombination velocity-diffusion length product. Calculations demonstrated that the surface recombination current was a decreasing part of the total current as the area increased and that $s_oL_s=0.3$ cm$^2$/sec for a device with an oxygen-doped $As_{0.5}Ga_{0.5}As$ layer as compared to a value of 3.7 cm$^2$/sec for a similar device without the $Al_{0.5}Ga_{0.5}As$ layer where I varies linearly with d. The oxygen-doped $Al_{0.5}Ga_{0.5}As$ layer reduced $s_oL_s$ by a factor of 12 and permitted te n=1 bulk diffusion current to dominate for current densities in excess of $5\times 10^{-3}$ A/cm$^2$.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What we claim is:

1. A GaAs device with reduced surface recombination current comprising
   a monocrystalline GaAs body (10) having a localized zone (26) of conductivity different from adjacent portions of said body,
   a monocrystalline layer (16) of oxygen-doped AlGaAs on a major surface of said body, said AlGaAs layer having a low resistivity central portion (16.2) in substantial registration with said zone and a semi-insulating peripheral portion (16.1) surrounding said central portion,
   a dielectric passivation layer (18) covering said peripheral portion of said AlGaAs layer,
   a first electrical contact (20) to said central portion of said AlGaAs layer, and
   a second electrical contact (24) to said body.

2. The device of claim 1 wherein said localized zone is of one conductivity type and said adjacent portions of said body are of the opposite conductivity type.

3. The device of claim 2 wherein said zone contains Zn impurities to render it p-type.

4. The device of claim 1 wherein said localized zone has a higher conductivity than said adjacent portions but is of the same conductivity type as said adjacent portions.

5. The device of claim 1 wherein said peripheral portion of said AlGaAs layer has a resistivity in the range of about $5 \times 10^8$ to $5 \times 10^{12}$ $\Omega$-cm and said central portion has a resistivity of the order of $10^{-1}$ to $10^{-3}$ $\Omega$-cm.

6. The device of claim 5 wherein said AlGaAs layer is a direct gap material and has a thickness sufficient to prevent any substantial tunneling therethrough.

7. The device of claim 4 wherein said dielectric layer comprises silicon nitride.

8. The device of claim 1 wherein said body comprises a GaAs substrate and a GaAs epitaxial layer grown on a major surface of said substrate, and wherein said zone is located in said epitaxial layer.

* * * * *